(12) United States Patent
Hsieh et al.

(10) Patent No.: US 8,703,364 B2
(45) Date of Patent: Apr. 22, 2014

(54) METHOD FOR REPAIRING PHOTOMASK

(75) Inventors: Kun-Lung Hsieh, Kaohsiung (TW); Chung-Hung Lin, Tainan (TW); Min-An Yang, Taichung (TW); Chih Wei Wen, Tainan (TW); Wu Hung Ko, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 50 days.

(21) Appl. No.: 13/465,266

(22) Filed: May 7, 2012

(65) Prior Publication Data

US 2013/0295494 A1  Nov. 7, 2013

(51) Int. Cl.
*G03F 1/72* (2012.01)

(52) U.S. Cl.
USPC .................. 430/5; 430/945; 382/144

(58) Field of Classification Search
USPC ....................... 430/5, 945; 382/144
See application file for complete search history.

(56) References Cited

U.S. PATENT DOCUMENTS

| 5,965,301 | A | * | 10/1999 | Nara et al. | 430/5 |
| 6,103,430 | A | * | 8/2000 | Yang | 430/5 |
| 6,340,543 | B1 | * | 1/2002 | Nagamura et al. | 430/5 |
| 6,476,882 | B1 | | 11/2002 | Sakurai | |
| 7,070,889 | B2 | * | 7/2006 | Ohashi et al. | 430/5 |
| 7,916,930 | B2 | * | 3/2011 | Zibold et al. | 382/144 |
| 8,124,300 | B1 | * | 2/2012 | Singh et al. | 430/5 |
| 8,153,338 | B2 | * | 4/2012 | Park et al. | 430/5 |

OTHER PUBLICATIONS

Toshihiro Torigoe, "Development for Laser CVD Repair SLA58C," NEC, vol. 51, No. 9/2001, Laser Solution Division, pp. 35-38.

* cited by examiner

*Primary Examiner* — Christopher Young
(74) *Attorney, Agent, or Firm* — Haynes and Boone, LLP

(57) ABSTRACT

A method for repairing a defect, such as a pinhole, on a photomask is described. In an example, a laser beam is used to form a matrix of laser burn spots in a substrate of the photomask proximate a defect, such as a pinhole, of the photomask. Each laser burn spot is formed at a focal point of the laser beam inside the substrate by melting a material of the substrate proximate to the defect. In an example, the defect is surrounded and covered by the matrix of laser burn spots. The matrix of laser burn spots can attenuate or block light from passing through the defect, such as the pinhole. The matrix of laser burn spots may repair the defect of the photomask without removing a pellicle and pellicle frame mounted on the photomask.

19 Claims, 8 Drawing Sheets

METHOD FOR REPAIRING PHOTOMASK

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, a lithography process uses a photomask to transfer an IC design layout pattern to a wafer substrate by an optical exposing tool (such as a stepper or a scanner). A portion of light from the exposing tool is blocked by a patterned chrome layer of the photomask to project patterned light onto a resist film deposited on the wafer substrate. The exposed resist film is then developed by a developer to form a resist pattern on the wafer substrate. Defects on the photomask, such as a pinhole in the patterned chrome layer of the photomask, pose challenges to the lithography process. For example, light can pass through the defect, such as the pinhole in the patterned chrome layer of the photomask, leading to unwanted light projected onto the resist film. An unwanted pattern is thus formed on the wafer substrate, and the wafer may be scrapped because of the unwanted pattern.

Accordingly, what is needed is a method that addresses the above issues and repairs the defect on the photomask during the photomask fabrication or the photomask allocation in a wafer fab.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

Figure 1:
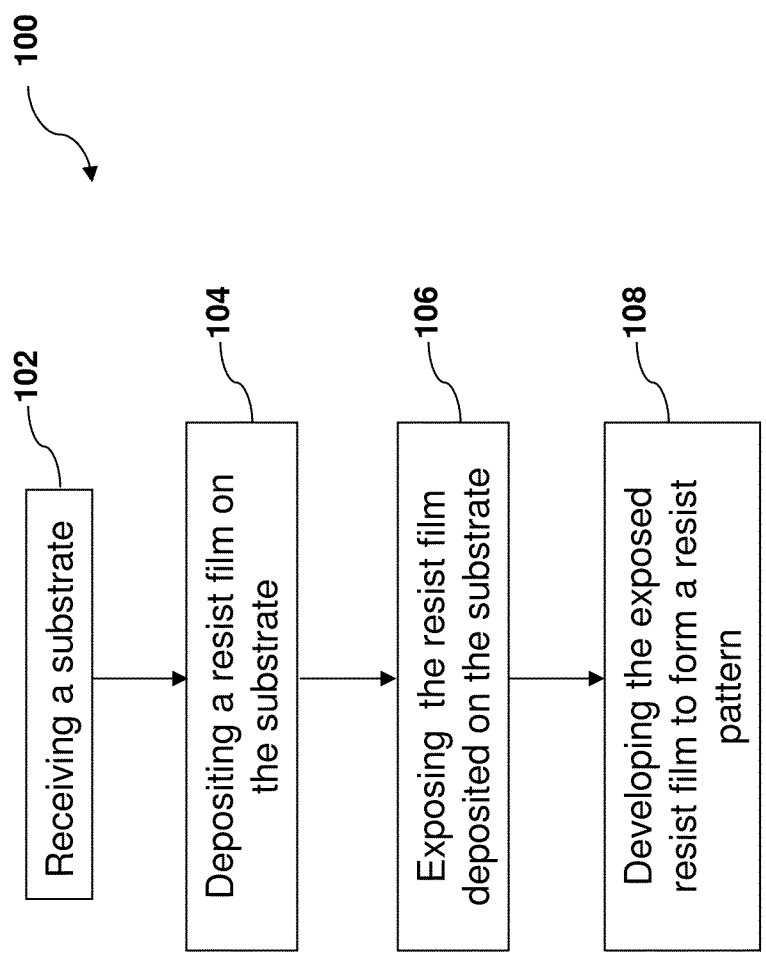
FIG. 1 is a flow chart of a method for forming a resist pattern for implementing one or more embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, a flow chart of a method 100 is an example of forming a resist pattern on a wafer substrate for implementing one or more embodiments of the present disclosure. The method 100 begins at step 102 by providing or receiving a substrate. The method 100 proceeds to step 104 by depositing a resist film on the substrate, for example, by a spin-on coating process on a coating track. In the present disclosure, a resist is also referred to as a photo resist. The step 104 may include performing a dehydration process before applying the resist film on the substrate to enhance an adhesion of the resist film to the substrate. The dehydration process may include baking the substrate at a high temperature for a duration of time, or applying a chemical such as hexamethyldisilizane (HMDS) to the substrate. The step 104 may also include a soft bake (SB) to increase a mechanical strength of the resist film. After step 104, the method 100 proceeds to step 106 for exposing the resist film deposited on the substrate by an exposing tool to form a latent image pattern on the resist film. The exposing tool may include an optical exposing tool, such as ultraviolet (UV), I-line (365 nm), deep ultraviolet (DUV), extreme ultraviolet (EUV), or X-ray exposing tool, or a charged particle tool such as an electron beam writer. The method 100 proceeds to step 108 by developing the exposed resist film to form a resist pattern on a wafer substrate on a developing track. The step 108 may include a post expose bake (PEB), a post develop bake (PDB), or both. Additional steps can be provided before, during, and after the method 100, and some of the steps described can be replaced, eliminated, or moved around for additional embodiments of the method 100.

Figure 2:
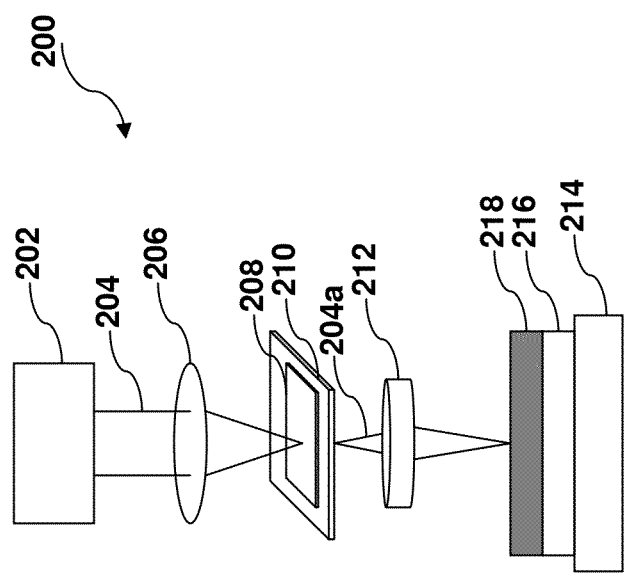
FIG. 2 is a schematic diagram of a lithography system for implementing one or more embodiments of the present disclosure.

Referring now to FIG. 2, an optical lithography system 200 is an example of a system that can benefit for one or more embodiments of the present disclosure. The optical lithography system 200 includes a light source 202, a light 204, a patterned light 204a, a condense lens 206, a photomask 208, a mask stage 210, a projection lens 212, a substrate stage 214, a substrate 216 and a resist film 218. However, other configurations and inclusion or omission of the device may be possible. In the present disclosure, the system 200 is also referred as a stepper or a scanner, and the photo mask 208 is also referred to as a mask, a photo mask, or a reticle. In the present embodiment, the light source 202 includes a radiation source providing the light 204 having a wavelength range from UV to DUV. For example, a mercury lamp provides UV wavelength, such as G-line (436 nm) or I-line (365 nm), or an excimer laser provides DUV wavelength, such as 248 nm, 193 nm, or 157 nm. The condense lens 206 is configured to guide the light 204 to the photomask 208. The photomask 208 blocks a portion of the light 204 and provides an aerial image of the light 204 to form the patterned light 204a. The photomask 208 may be a binary mask (BIM), a super binary mask (SBIM), or a phase shift mask (PSM), which includes an alternative phase shift mask (alt. PSM) or an attenuated phase shift mask (att. PSM). The photo mask 208 is positioned on the mask stage 210. The mask stage 210 includes a plurality of motors, roller guides, and tables; secures the photomask 208 on the mask stage 210 by vacuum; and provides accurate position and movement of the photomask 208 in X, Y, and Z directions during alignment, focus, leveling and exposure operation in the optical lithography system 200. The projection lens 212 includes a magnification lens for reducing the pattern image provided by the photomask 208 and guides the patterned light 204a to the resist film 218 deposited on the substrate 216 secured by the substrate stage 214. The substrate stage 214 includes motors, roller guides, and tables; secures the substrate 216 by vacuum; and provides accurate position and movement of the substrate 216 in X, Y, and Z directions during alignment, focus, leveling and exposure operations in the optical lithography system 200 so that the image of the photomask is transferred onto the substrate in a repetitive fashion (though other lithography methods are possible). The system 200, or portions thereof, may include additional items, such as a vacuum system and/or a cooling system.

Continuing with the present embodiments, the substrate 216 deposited with the resist film 218 is loaded on the substrate stage 214 for exposing by the patterned light 204a. The resist film 218 includes a positive tone resist or a negative tone resist. The substrate 216 includes a wafer substrate. The wafer substrate includes a silicon wafer. Alternatively or additionally, the wafer may includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In yet another alternative, the wafer is a semiconductor on insulator (SOI). A plurality of conductive and non-conductive thin films may be deposited on the wafer. For example, the conductive thin films may include a metal such as aluminum (Al), copper (Cu), tungsten (W), nickel (Ni), titanium (Ti), gold (Au), and platinum (Pt), or alloys thereof. The insulator film may include silicon oxide or silicon nitride. The substrate may be a blank mask substrate that includes a low thermal expansion material such as quartz, silicon, silicon carbide, or silicon oxide-titanium oxide compound.

Figure 3:
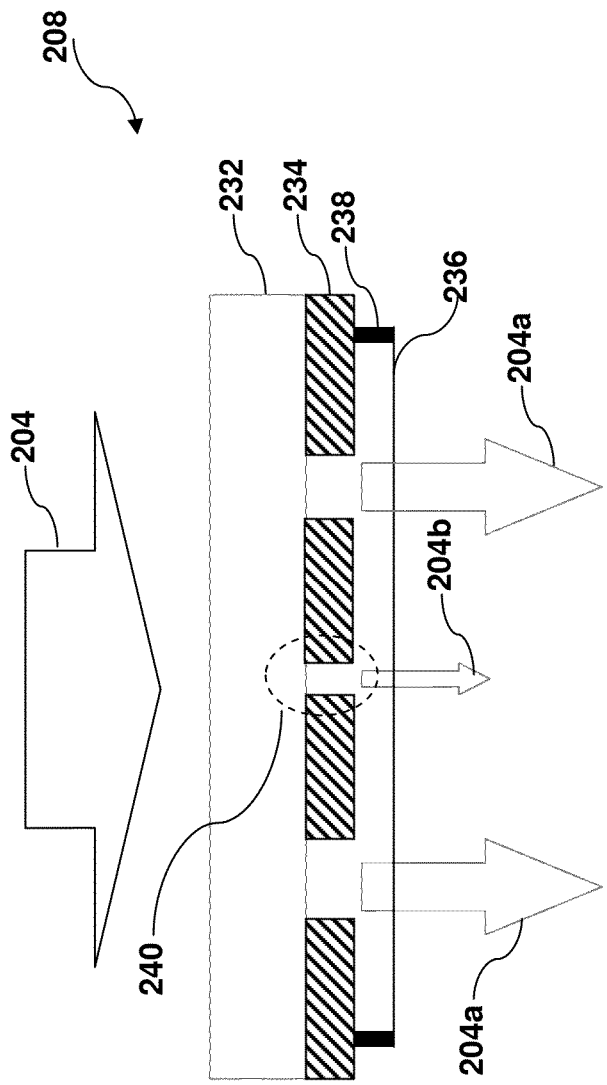
FIG. 3 is a diagrammatic cross-sectional side view of a photomask with a defect according to one or more embodiments of the present disclosure

Referring now to FIG. 3, a diagrammatic cross-sectional side view of the photomask 208 with a pinhole is illustrated according to one or more embodiments of the present disclosure. The photomask 208 includes a photomask substrate 232, a patterned light block layer 234, a pellicle 236, and a pellicle frame 238. However, other configurations and inclusion or omission of the device may be possible. The photomask substrate 232 includes fused silica, fused quartz, calcium fluoride ($CaF_2$), silicon carbide, silicon oxide-titanium oxide alloy, or other suitable low thermal expansion material (LTEM). In the present disclosure, the photomask substrate 232 is also referred to as a glass or quartz substrate. The patterned light block layer 234 blocks a portion of the light 204 from the light source 202 and provides the patterned light 204a to the resist film 218 as shown in FIG. 2. The patterned light block layer 234 includes chrome, MoSi, or both. In the present disclosure, the patterned light block layer 234 is also referred to as a patterned chrome layer. The pellicle 236 is mounted to the patterned light block layer 234 on the photomask 208 by the pellicle frame 238 with a glue material. The pellicle 236 prevents particles from falling on the pattered light block layer 234. The pellicle 236 is a thin polymer film such as a nitrocellulose or Teflon film. The pellicle 236 is transparent, mechanically strong, and resistant to light radiation damage. As shown in FIG. 3, if a defect 240, such as a pinhole exists on the patterned light block layer 234, unwanted light 204b is emitted from the photomask 208. Thereby, the unwanted light 204b is projected to the resist film 218 deposited on the substrate 216 by the projection lens 212 shown in FIG. 2.

Figure 4:
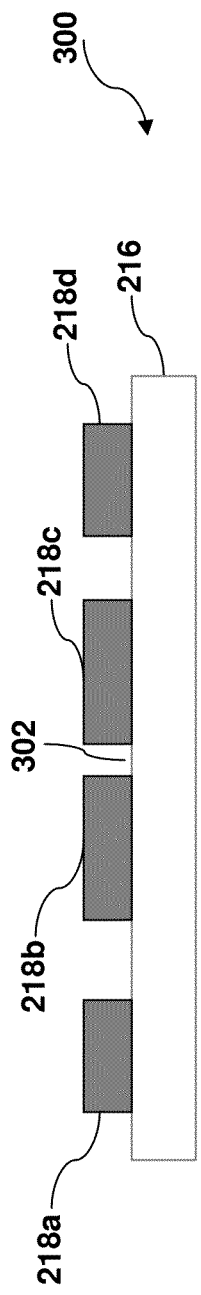
FIGS. 4-5 are diagrammatic cross-sectional side views of forming a resist pattern using a defected photomask according to one or more embodiments of the present disclosure.
Figure 5:
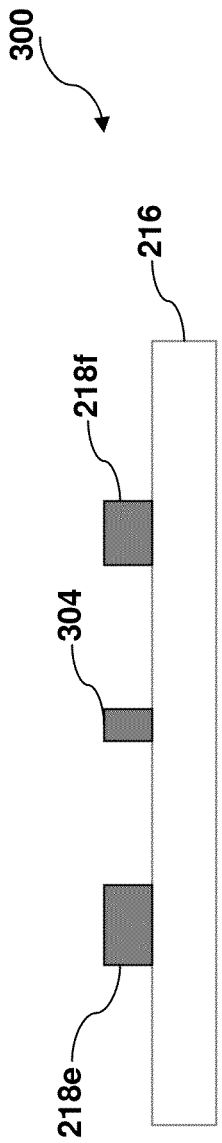

Referring to FIGS. 4-5, diagrammatic cross-sectional side views of forming a resist pattern of a device 300 by the photomask 208 as shown in FIG. 3, are illustrated according to one or more embodiments of the present disclosure. The device 300 includes a substrate 216 and resist patterns 218a-218f. However, other configurations and inclusion or omission of the device may be possible. As shown in FIG. 2, when the patterned light 204a is projected to the resist film 218 deposited on the substrate 216, the final resist pattern depends on the resist tone of the resist film 218. For example, if the resist film 218 is a positive tone resist applied to the substrate 216, the exposed portion of the resist film 218 is dissolved during the developing process and the unexposed portion of the resist film 218 remains to form patterns 218a-218d as shown in FIG. 4. If the photomask 208 includes the pinhole defect 240 shown in FIG. 3, the unwanted light 214b is projected to the resist film 218, and a hole defect 302 is formed in the patterned resist film shown in FIG. 4. The hole defect 302 is then transferred to the device 300 during fabrication and may be repeatedly printed on each die of the device 300 during fabrication. In another example, if the resist film 218 is a negative tone resist applied to the substrate 216, the unexposed portion of the resist film 218 is dissolved during the developing process and the exposed portions of the resist film 218 remain after the developing process to form patterns 218e-218f as shown in FIG. 5. If the photomask 208 includes the pinhole defect 240 shown in FIG. 3, the unwanted light 204b is projected to the resist film 218, and a dot defect 304 is formed in the patterned resist film shown in FIG. 5. The dot defect 304 is then transferred to the device 300 during fabrication and may be repeatedly printed on each die of the device 300 during fabrication. Thus, defects in a photomask, such as the pinhole defect 240 in the patterned chrome layer 234 of the photomask 208, can present serious challenges in IC circuit fabrication.

Figure 6:
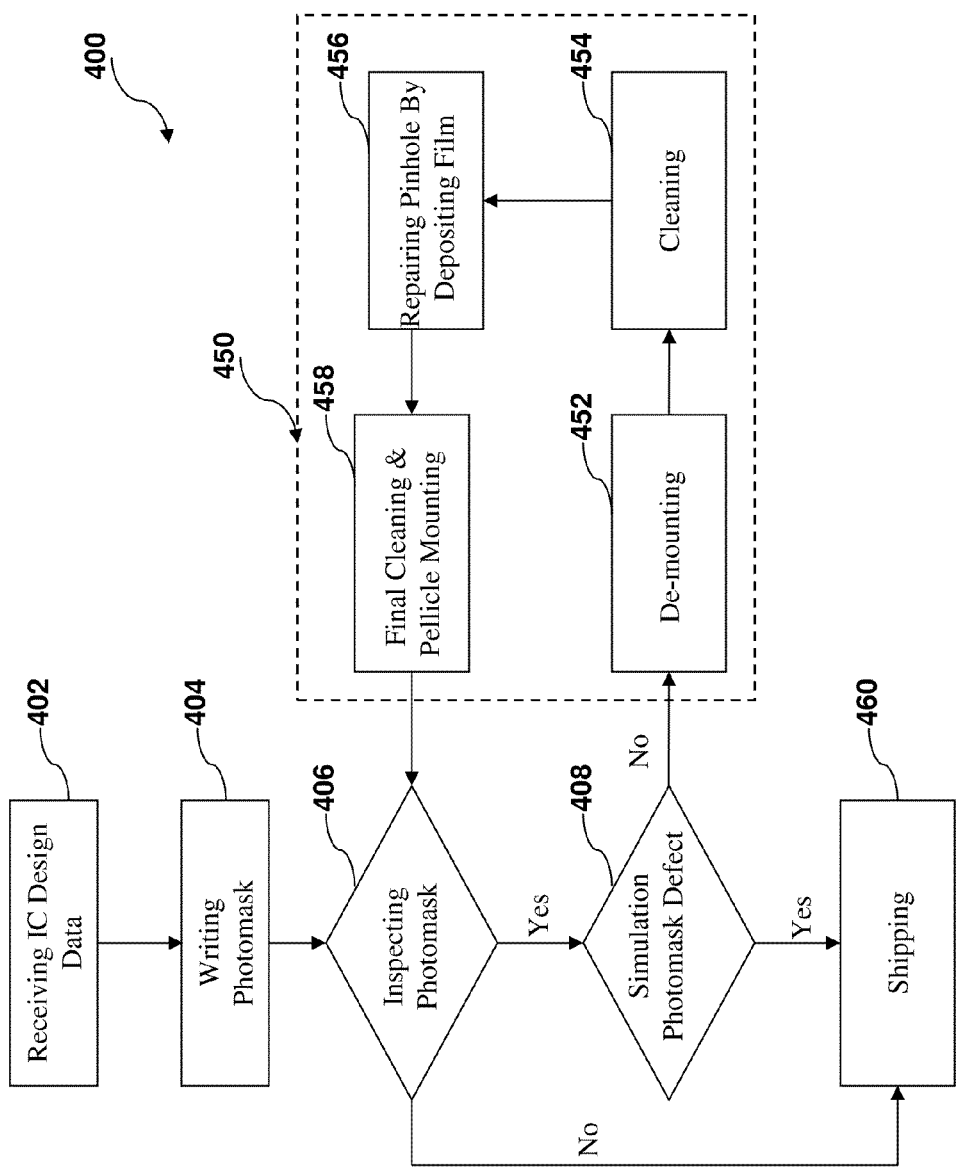
FIG. 6 is a flow chart of a method for forming a photomask for implementing one or more embodiments of the present disclosure

Referring now to FIG. 6, a flow chart of a method 400 is an example for forming a photomask for implementing one or more embodiments of the present disclosure. In the present embodiments, the photomask may be a binary mask (BIM), a super binary mask (SMIM), or a phase shift mask (PSM), which includes an alternative phase shift mask (alt. PSM) or an attenuated phase shift mask (att. PSM). The method 400 begins at step 402 by providing or receiving an IC design layout data (or IC design layout pattern) from a designer. The designer can be a separate design house or can be part of a semiconductor fabrication facility (fab) for making IC productions according to the IC design layout. In various embodiments, the semiconductor fab may be capable of making photomasks, semiconductor wafers, or both. The IC design layout includes various geometrical features designed for an IC product and based on a specification of the IC product. The method 400 proceeds to step 404 by transferring the IC design layout pattern to a photomask blank by an electron beam writer and forming a patterned photomask. The step 404 includes performing an optical proximity correction (OPC) to the IC design layout data with the plurality of features, fracturing the OPC modified IC design layout data, and converting the fractured data to an electron beam writer format data. The step 404 further includes depositing a resist film on the photomask blank, exposing the resist film deposited on the photomask blank by the electron beam writer with the electron beam writer format data, and developing the exposed resist film to form the patterned photomask. The step 404 also includes mounting a pellicle by a pellicle frame and a glue material on the photomask.

The method continuously proceeds to step 406 for inspecting the photomask. The step 406 includes inspecting patterns on the photomask against the IC design layout pattern by a photomask inspection tool. If no defect is found, the method 400 proceeds to step 460 for shipping process. If a defect, such as a pinhole defect in a patterned chrome layer of the photomask, is found during photomask inspection, the method 400 proceeds to step 408 for a simulation process. The step 408 includes performing a photo lithography process simulation using the photomask with the pinhole to determine whether the pinhole is a printable defect on a wafer, and if the pinhole is a printable defect, the method 400 may determine whether the printed defect on the wafer within a specification (in other words, whether the printed defect is smaller than a specified dimension). If the pinhole is not printable on the wafer, or if the printed defect is within the specification on the wafer, the method 400 proceeds to step 460 for the shipping process. If the simulation result shows that the pinhole is printable on the wafer and is out of specification (OOS) (in other words, the printed defect is larger than a specified dimension), the method 400 proceeds to step 450 for a photomask rework process. The step 450 includes multiple sub-steps. The step 450 starts at sub-step 452 for a de-mounting process. The sub-step 452 includes removing the pellicle and the pellicle frame from the photomask. After sub-step 452, the step 450 proceeds to sub-step 454 for washing away glue residues on the photomask. Then, the step 450 proceeds to sub-step 456 for repairing the pinhole. The sub-step 456 includes depositing a chrome related compound patch and filling the pinhole by a laser chemical vapor deposition (CVD) method. After the sub-step 456, the step 450 proceeds to sub-step 458 for a final clean and pellicle mounting process. The photomask rework step 450 returns to the step 406 of the method 400 for photomask inspection after the sub-step 458 of the step 450. If no defect is found, the method 400 proceeds to step 460 for shipping. If the pinhole is found, the method 400 proceeds to repeat step 408 for simulation, step 450 for photomask rework, and step 406 for the inspection. Additional steps can be provided before, during, and after the method 400, and some of the steps described can be replaced, eliminated, or moved around for additional embodiments of the method 400.

Figure 7:
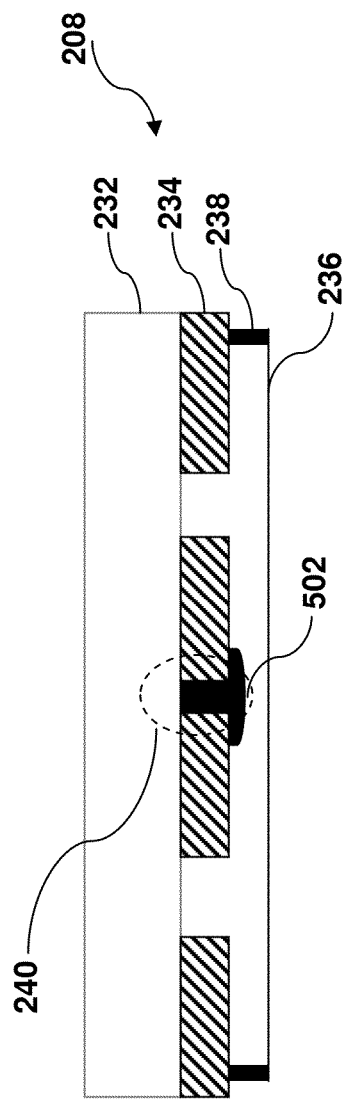
FIG. 7 is a diagrammatic cross-sectional side view of a photomask with a fixed defect according to one or more embodiments of the present disclosure

Referring now to FIG. 7, a diagrammatic cross-sectional side view of the photomask 208 with the pinhole defect 240 repaired is illustrated according to one or more embodiments of the present disclosure. The photomask 208 includes the photomask substrate 232, the patterned light block layer 234, the pellicle 236, the pellicle frame 238, the pinhole 240, and a patch 502. However, other configurations and inclusion or omission of the device may be possible. As discussed above, with reference to FIG. 6, if the pinhole 240 of the photomask 208 is found at the step 406 of the method 400 and the pinhole 240 is found printable on a wafer by the simulation result at the step 408 of the method 400, the pinhole 240 is repaired with the patch 502 in the step 450 of the method 400. In the step 450, to repair the pinhole 240 with the patch 502 shown in FIG. 7, the pellicle 236 and the pellicle frame 238 of the photomask 208 are removed first at the sub-step 452; the photomask 208 proceeds to the sub-step 454 for cleaning processes to wash away glue residue; the patch 502 is deposited to fill the pinhole 240 of the photomask 208, for example, by a laser chemical vapor deposition (CVD) at the sub-step 456; and then the pellicle 236 and the pellicle frame 238 are remounted to the photomask 208 at the sub-step 458 to finish the photomask rework process. The photomask rework process described at step 450 of the method 400 is cost and time consuming. For example, the processes associated with removing the pellicle 236 and pellicle frame 238 consume a significant amount of time and resources. Further, the patch 502 may peel off during cleaning processes implemented at sub-step 458. Other chrome (for example, from the patterned chrome layer) on the photomask may also peel off during the multiple cleaning processes of the photomask rework process. Even further, when the photomask 208 with the repaired pinhole 240 is used during wafer fabrication, the patch 502 may vaporize by a light radiation during an exposure process from a stepper or a scanner, leading to the pinhole 240 being printable again despite previous efforts to repair such.

Figure 8:
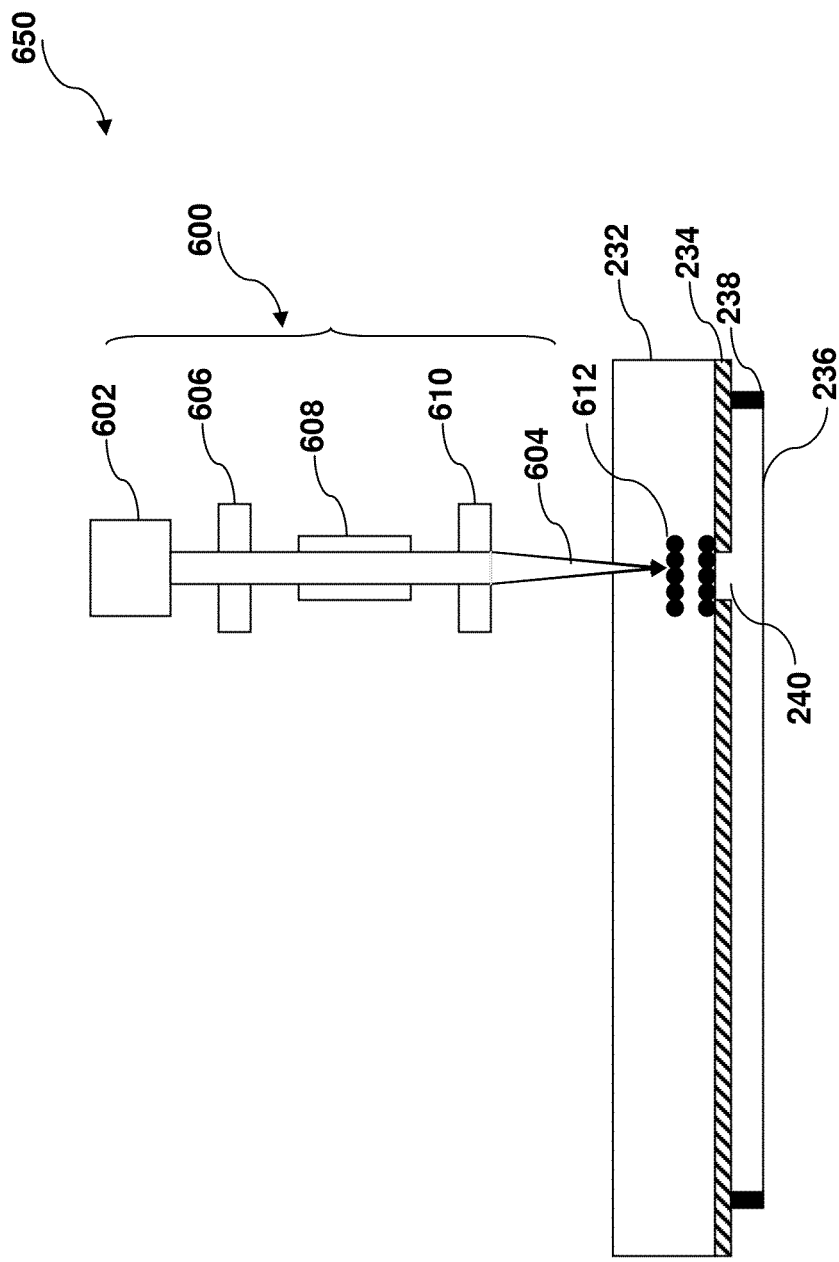
FIG. 8 is a diagrammatic cross-sectional side view of a photomask with a fixed defect by a laser beam according to one or more embodiments of the present disclosure

Referring now to FIG. 8, a diagrammatic cross-sectional side view of a laser burning process 650 for repairing the pinhole 240 of the photomask 208 by a pulse laser tool 600 is illustrated for implementing one or more embodiments of the present disclosure. The pulse laser tool 600 includes a pulse laser source 602, a laser beam 604, a laser beam stabilizer 606, a laser beam expander 608, and a laser beam focus lens 610. However, other configurations and inclusion or omission of the device may be possible. The pulse laser source 602 generates the laser beam 604; the laser beam 604 travels through the laser beam stabilizer 606, the laser beam expander 608, and the laser beam focus lens 610 such that the laser beam 604 focuses at a focal point in the substrate 232 of the photomask 208.

Continuing in the present embodiment, the laser beam 604 has high energy at the focal point and can provide a high temperature at the focal point to melt a material, such as glass, quartz, or fused silicon, which is used as the substrate 232 of the photomask 208. For example, if the focal point of the laser beam 604 is projected inside the substrate 232 of the photomask 208, the material of the substrate 232 at the focal point melts to form a burn spot. The burn spot changes a transparent property of the substrate 232. The high energy laser beam 604 can thus repair the pinhole 240 of the photomask 208 without removing the pellicle 236 and the pellicle frame 238, as shown in FIG. 8. In the depicted embodiment, the laser beam 604 from the laser tool 600 is focused inside the substrate 232 surrounding the pinhole 240. The laser beam 604 generates high temperatures at the focal point to melt the material (in the present example, quartz) of the substrate 232 at the focal point and generates a laser burn spot 612. The laser burn spots 612 can change a light transparent behavior of the substrate 232. In the depicted embodiment, laser burn spots 612 form a matrix of laser burn spots 612 (shelter layer) inside the substrate 232 surrounding the pin hole 240 as shown in FIG. 8. Light transparency is attenuated or blocked by the matrix of laser burn spots 612 so that the pin hole 240 is repaired by the laser burning process 650.

As shown in FIG. 8, the matrix of laser burn spots 612 may be a single layer matrix (2-dimensional) of laser burn spots 612 or a multiple layer matrix (3dimensional) of the laser burn spots 612. A light transparency attenuated by the matrix of laser burn spots depends on a size of each of the laser burn spots, a dimension of the matrix of laser burn spots, a number of layers of the laser burn spots within the matrix of laser burn spots, a pitch between adjacent laser burn spots, a density of the laser burn spots, and combination thereof.

It has been observed that light transparency of a pinhole of a photomask, such as the pinhole 240 of the photomask 208, is 6-8% of the original light transparency measured by a Zeiss AIMS 193i tool in the step 408 of the method 400 shown in FIG. 6. It has further been observed that such light transparency is significantly reduced by forming the matrix of laser burn spots in the substrate of the photomask proximate the pinhole, such as the matrix of laser burn spots 612 in the substrate 232 proximate the pinhole 240. In an example, the light transparency can be reduced to 0.5% by a seven layer matrix of the laser burn spots having a dimension of about 70×70 um$^2$, where each laser burn spot has a size of about 2×2 um$^2$. In another example, the light transparency can be reduced to 0.3% by a nine layer matrix of the laser burn spots having a dimension of about 70×70 um$^2$, where each laser burn spot has a size of about 2×2 um$^2$. In yet another example, the light transparency can be reduced to 0.15% by a nine layer matrix of the laser burn spots having a dimension of about 100×100 um$^2$, where each laser burn spot has a size of about 2×2 um$^2$. With such low light transparency, light intensity impact on a resist film is negligent so that the pinhole 240 on the photomask 208 is repaired by the laser burning process 650. Such repair can be implemented without removing the pellicle 236 and the pellicle 238 from the photomask 208. Further, repairing the pin hole 240 by the matrix of laser burn spots 612 is permanent, thereby reducing production cost and improving production cycle time. The risk for peeling off of other chrome, such as that experienced when repairing the pin hole using a filler (as described with reference to FIGS. 6 and 7, is also reduced). Repairing the pin hole 240 on the photomask 208 by the laser burning process 650 can be applied to various photomasks, such as binary mask (BIM), super binary mask (SMIM), and phase shift mask (PSM), which includes an alternative phase shift mask (alt. PSM) and an attenuated phase shift mask (att. PSM).

Figure 9:
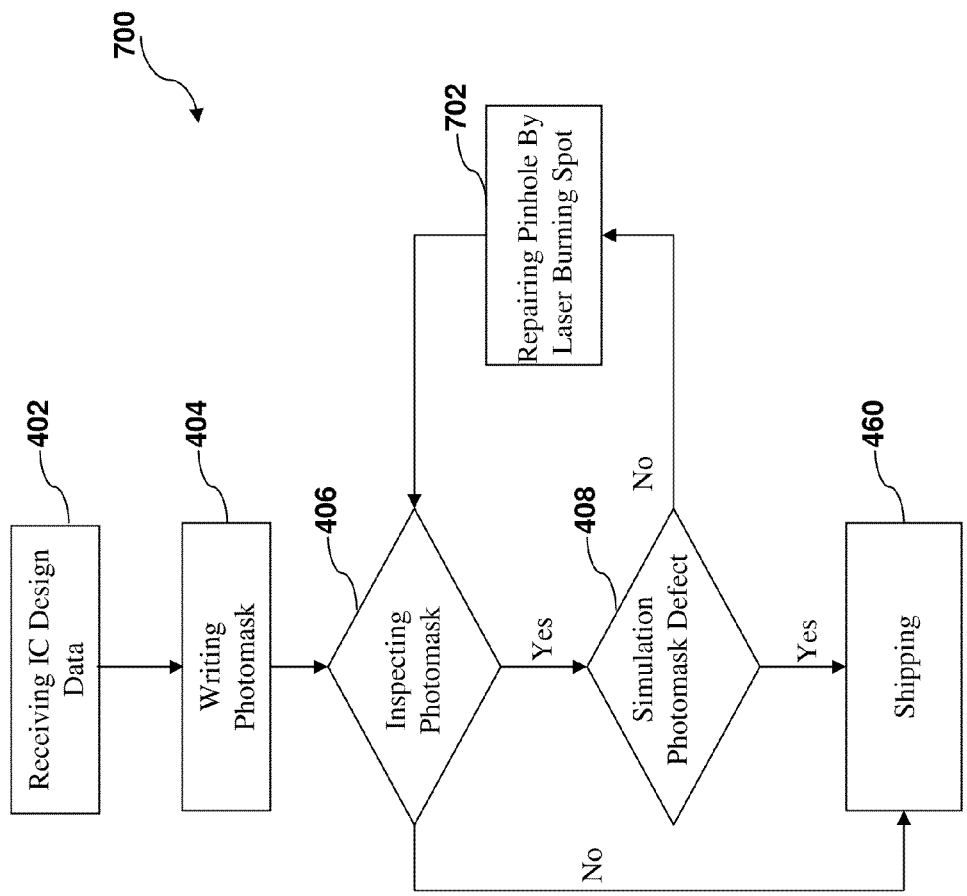
FIG. 9 is a flow chart of a method for forming a photomask for implementing one or more embodiments of the present disclosure

Referring now to FIG. 9, a flow chart of a method 700 is an example for forming a photomask for implementing one or more embodiments of the present disclosure. In the present embodiments, the photomask may be a binary mask (BIM), a super binary mask (SMIM), or a phase shift mask (PSM), which includes an alternative phase shift mask (alt. PSM) or an attenuated phase shift mask (att. PSM). The method 700 begins at step 402 by providing or receiving an IC design layout data (or IC design layout pattern) from a designer. The designer can be a separate design house or can be part of a semiconductor fabrication facility (fab) for making IC productions according to the IC design layout. In various embodiments, the semiconductor fab may be capable of making photomasks, semiconductor wafers, or both. The IC design layout includes various geometrical features designed for an IC product and based on a specification of the IC product. The method 700 proceeds to step 404 by transferring the IC design layout pattern to a photomask blank by an electron beam writer and forming the patterned photomask. The step 404 includes performing an optical proximity correction (OPC) to the IC design layout data with the plurality of features, fracturing the OPC modified IC design layout data, and converting the fractured data to an electron beam writer format data. The step 404 further includes depositing a resist film on the photomask blank, exposing the resist film deposited on the photomask blank by the electron beam writer with the electron beam writer format data, and developing the exposed resist film to form the patterned photomask. The step 404 also includes mounting a pellicle by a pellicle frame and a glue material on the photomask.

The method continuously proceeds to step 406 for inspecting the photomask. The step 406 includes inspecting patterns on the photomask against the IC design layout pattern by a photomask inspection tool. If no defect is found, the method 700 proceeds to step 460 for shipping process. If a defect, such as a pinhole in the patterned chrome layer of the photomask, is found during photomask inspection, the method 700 proceeds to step 408 for a simulation process. The step 408 includes simulating a lithography process using the photomask having the pinhole defect to determine if the pinhole is a printable defect on a wafer, and if the pinhole is printable defect, the method 400 may determine whether the printed defect on the wafer is within a specification (in other words, whether the printed defect is smaller than a specified dimension). If the pinhole is not printable on the wafer, or the printed defect is within the specification on the wafer, the method 700 proceeds to step 460 for shipping. If the simulation result shows that the pinhole is printable on the wafer and is out of the specification (OOS) (in other words, the printed defect is larger than a specified dimension), the method 700 proceeds to step 702 for repairing the pinhole using a laser burn spot, such as that described with reference to FIG. 8. It is noted that in some situations a defect is repaired if its printable on a wafer, and in other situations, a defect is repaired if its printable on the wafer and it is out of specification. In an example, the step 702 includes generating a matrix of laser burn spots inside the substrate of the photomask, such that the matrix of laser burn spots cover an area surrounding the pinhole of the photomask substrate. The matrix of laser burn spots can attenuate or block a light so that the pinhole is repaired. The matrix of laser burn spot may be a single layer of laser burn spots or a multiple layer of laser burning spots. After the step 702, the method 700 returns to the step 406 of the method 700 for photomask inspection again. If no defect is found, the method 700 proceeds to step 460 for shipping. If the pinhole is found, the method 700 proceeds to repeat step 408 for simulation, step 702 for repairing the pinhole, and step 406 for the inspection. Additional steps can be provided before, during, and after the method 700, and some of the steps described can be replaced, eliminated, or moved around for additional embodiments of the method 700.

Thus, the present disclosure describes a method for fabricating a photomask including repairing a defect on a photomask during the fabrication of the photomask. The method for fabricating a photomask includes receiving an integrate circuit (IC) design layout, fabricating the photomask based on the IC design layout, determining whether the photomask includes any printable defect, and repairing the printable defect by modifying a substrate of the photomask proximate to the printable defect if the photomask includes a printable defect. The method further includes inspecting the photomask. Determining whether the photomask includes any printable defect includes simulating a lithography process using the photomask. Modifying a substrate of the photomask proximate to the printable defect includes forming a laser burn spot in the substrate of the photomask. The substrate includes glass, quartz or fused silica, quartz, silicon carbide, calcium fluoride. Forming the laser burn spot in the substrate of the photomask includes using a focused laser beam to melt the substrate at a focal point. Forming the laser burn spot in the substrate of the photomask includes forming a matrix of laser burn spots in the substrate. The matrix of laser burn spots includes at lease one layer of laser burn spots. Forming the matrix of laser burn spots in the substrate of the photomask includes controlling a formation of the laser burn spots to achieve a desired attenuation of light transmitted by the printable defect. Controlling the formation of the laser burn spots includes controlling one of a size of each of the laser burn spots, a dimension of the matrix of laser burn spots, a number of layers of the laser burn spots within the matrix of laser burn spots, a pitch between adjacent laser burn spots, a density of the laser burn spots, and combination thereof. The photomask includes a pellicle and the printable defect of the photomask is repaired without removing the pellicle. The pintable defect is a pinhole defect.

In one embodiment, a method of repairing a photomask is described. The method includes receiving the photomask, determining whether the photomask includes any printable defect, and repairing the printable defect by modifying a substrate of the photomask proximate to the printable defect if the photomask includes a printable defect. The method further includes inspecting the photomask by scanning the photomask against an integrated circuit (IC) design layout. The photomask includes a binary mask or a phase shift mask. Determining whether the photomask includes any printable defect includes performing a lithography process simulation using the photomask and verifying the printable defect is out of specification. Repairing the printable defect includes forming a matrix of laser burn spots proximate to the printable defect in a substrate of the photomask by a focused laser beam.

In another embodiment, a method for repairing a photomask by a focused laser beam is described. The method includes receiving the photomask from a wafer manufacture fab or a photomask fabrication shop, determining whether the photomask includes any printable defect by performing a lithography process simulation using the photomask and verifies that the defect is the printable defect and is out of specification, and repairing the printable defect by modifying a substrate of the photomask proximate to the printable defect without removing a pellicle amounted on the photomask if the photomask includes a printable defect. The method of further includes inspecting the photomask using a photomask inspection tool. Repairing the printable defect includes melting a substrate of the photomask by the focused laser beam to form a matrix of laser burn spots proximate to the printable defect in the substrate of the photomask, the matrix of laser burn spots attenuated a light transmitted by the pintable defect so that the printable defect is repaired without removing a pellicle from the photomask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a photomask, the method comprising:
   receiving an integrated circuit (IC) design layout;
   fabricating the photomask based on the IC design layout;
   determining whether the photomask includes any pinhole defect; and
   if the photomask includes a pinhole defect, repairing the pinhole defect by modifying a substrate of the photomask proximate to the pinhole defect.

2. The method of claim 1, wherein the determining whether the mask includes any pinhole defect includes:
   inspecting the photomask for pinhole defects; and
   if the inspecting reveals pinhole defects in the photomask, simulating a lithography process using the photomask to determine whether the pinhole defect is printable during the lithography process.

3. The method of claim 2, wherein the determining whether the mask includes any pinhole defect includes, if a pinhole defect is printable during the lithography process, determining whether the pinhole defect is out of specification.

4. The method of claim 1, wherein the modifying the substrate of the photomask proximate to the pinhole defect includes forming a laser burn spot in the substrate of the photomask.

5. The method of claim 4, wherein the substrate includes quartz.

6. The method of claim 4, wherein the forming the laser burn spot in the substrate of the photomask includes using a focused laser beam to melt the substrate at a focal point.

7. The method of claim 4, wherein the forming the laser burn spot in the substrate of the photomask includes forming a matrix of laser burn spots in the substrate.

8. The method of claim 7, wherein the matrix of laser burn spots includes at least one layer of laser burn spots.

9. The method of claim 7, wherein the forming the matrix of laser burn spots in the substrate of the photomask includes controlling a formation of the laser burn spots to achieve a desired attenuation of light transmitted by the pinhole defect.

10. The method of claim 9, wherein the controlling the formation of the laser burn spots includes controlling one of a size of each of the laser burn spots, a dimension of the matrix of laser burn spots, a number of layers of the laser burn spots within the matrix of laser burn spots, a pitch between adjacent laser burn spots, a density of the laser burn spots, and combination thereof.

11. The method of claim 1, wherein the photomask includes a pellicle and the pinhole defect of the photomask is repaired without removing the pellicle.

12. A method for repairing a photomask, the method comprising:
   receiving the photomask;
   determining whether the photomask includes any printable pinhole defect; and
   if the photomask includes a pinhole defect, repairing the pinhole defect by forming a laser burn spot in a substrate of the photomask proximate to the pinhole defect using a focused laser beam.

13. The method of claim 12, further comprising inspecting the photomask wherein the inspecting the photomask includes scanning the photomask against an integrated circuit (IC) design layout.

14. The method of claim 12, wherein the forming the laser burn spot in the substrate of the photomask proximate to the pinhole defect includes attenuating light transmittance of the substrate where the laser burn spot is formed.

15. The method of claim 12, wherein the determining whether the photomask includes any pinhole defect includes performing a lithography process simulation using the photomask and determining that the pinhole defect is out of specification.

16. The method of claim 12, wherein the forming the laser burn spot in the substrate of the photomask proximate to the pinhole defect includes forming a matrix of laser burn spots proximate to the pinhole defect.

17. A method for repairing a photomask, the method comprising:
- receiving the photomask;
- determining whether the photomask includes a pinhole defect that is out of specification; and
- if the photomask includes a pinhole defect that is out of specification, repairing the pinhole defect by modifying a substrate of the photomask proximate to the pinhole defect without removing a pellicle mounted on the photomask.

18. The method of claim 17, wherein determining whether the photomask includes a pinhole defect that is out of specification includes:
- inspecting the photomask for pinhole defects using a photomask inspection tool; and
- if a pinhole defect is found during the inspecting, simulating a lithography process using the photomask to determine whether the pinhole defect is printable, wherein a pinhole defect is out of specification if a size of the pinhole defect is greater than a threshold size.

19. The method of claim 17, wherein the repairing the pinhole defect includes melting a substrate of the photomask by a focused laser beam to form a matrix of laser burn spots proximate to the pinhole defect in the substrate of the photomask, the matrix of laser burn spots being configured to attenuate light transmitted by the pinhole defect.

* * * * *